Figure 1:
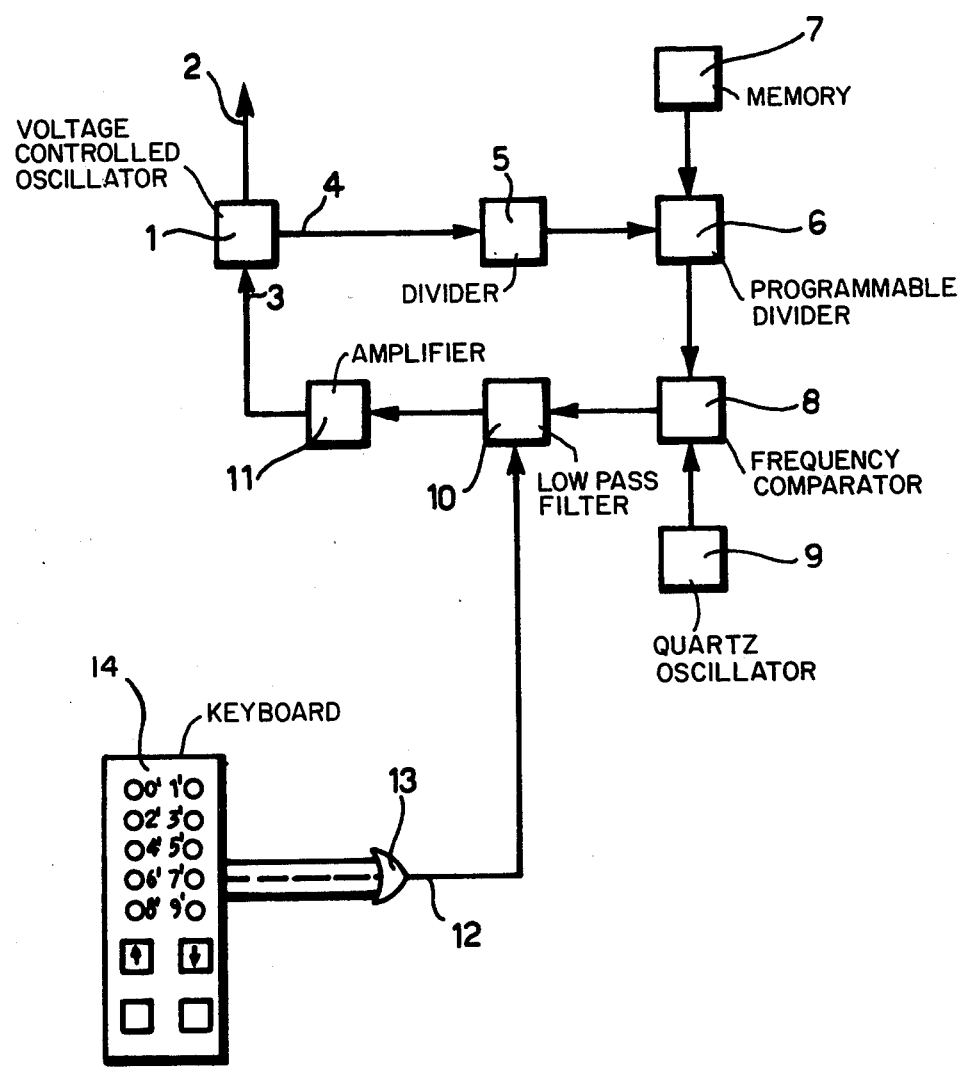

United States Patent [19]

Belisomi

[11] 4,142,158

[45] Feb. 27, 1979

[54] FREQUENCY SELECTION RECEIVER WITH VARIABLE TIME CONSTANT CONTROL LOOP

[75] Inventor: Pietro Belisomi, Pinerolo (Turin), Italy

[73] Assignee: Indesit Industria Elettrodomestici Italiana S.p.A., Rivalta (Turin), Italy

[21] Appl. No.: 808,498

[22] Filed: Jun. 21, 1977

[30] Foreign Application Priority Data

Jun. 25, 1976 [IT] Italy .................. 68558 A/76

[51] Int. Cl.² .............................................. H04B 1/06
[52] U.S. Cl. ..................................... 325/464; 325/421; 325/452; 331/1 A
[58] Field of Search ............................... 325/419–423, 325/452, 453, 464, 465, 468–470; 331/1 A, 17, 18, 25

[56] References Cited

U.S. PATENT DOCUMENTS

| | | | |
|---|---|---|---|
| 3,729,688 | 4/1973 | Cerny, Jr. et al. | 331/1 A |
| 3,980,951 | 9/1976 | Breeze et al. | 325/464 |
| 3,993,958 | 11/1976 | Cutsogeorge | 331/17 |
| 4,053,933 | 10/1977 | Collins | 325/464 |

Primary Examiner—Robert L. Griffin
Assistant Examiner—Jin F. Ng
Attorney, Agent, or Firm—Sughrue, Rothwell, Mion, Zinn and Macpeak

[57] ABSTRACT

A television or radio receiver having electronic means for selecting the frequency to which the receiver is to be tuned, in which the selection is effected by means of a voltage controlled oscillator controlled by a control loop which receives the output signal from the oscillator, divides it by a number derived from a memory which stores a plurality of numbers corresponding to the available frequencies for reception by the receiver, compares the divided signal with a reference frequency to generate an error signal, and feeds the error signal through a low pass filter back to the control input of the amplifier. The time constant of the filter can be changed by short circuiting a resistor of the filter so that the control loop operates with a short time constant when actually selecting a frequency whereas it operates with a longer time constant while maintaining a selected frequency.

8 Claims, 2 Drawing Figures

FREQUENCY SELECTION RECEIVER WITH VARIABLE TIME CONSTANT CONTROL LOOP

The present invention relates to a receiver for receiving transmitted signals, such as a radio or television receiver, having an improved device for tuning the receiver to a selected signal frequency for reception by the receiver. The present invention is particularly applicable to a receiver for television signals having a channel selection device including a voltage controlled oscillator (or VCO) the frequency of which is controlled by the voltage applied to a control input thereof by a control loop, the voltage being determined as a function of a number N, different for each selected frequency, which number is obtained from a memory circuit.

Devices of this general type have been proposed recently in order to replace the electromechanical devices (potentiometers) used until now in radio and television receivers with completely electronic devices by means of which it is possible to obtain better results, better reliability and a precision of tuning not only free from human error but also free from error due to thermal drift and other causes to which electromechanical devices are prone.

In such frequency selection devices a series of numbers, each corresponding to a respective selectable frequency for reception is memorized in a memory, for example a read-only memory (or ROM) when the receiver is manufactured. To select a frequency of a channel to be received, a number representing the selected channel is generated by a suitable device, such as, for example, a keyboard with, say, 10 number keys, like that of a pocket calculator, and this number is sent as an address to the memory which in consequence produces the stored number corresponding to the selected frequency. Using a keyboard with 10 keys it is possible to tune the receiver to any one of, for example, up to a hundred different frequencies, corresponding to a hundred television channels, with notable precision. The precision of tuning depends, in fact, only on the accuracy of the control loop and on the accuracy of the reference frequency generator which forms part of it; for accuracy the reference frequency generator may comprise, for example, a fixed quartz oscillator.

Such frequency selection devices generally also contain a circuit which determines the speed at which the control loop operates on the voltage controlled oscillator. The faster the control the quicker and more reliable is the adjustment to the output frequency of the voltage controlled oscillator, which is desirable, but at an optimum speed for such adjustment the circuit is too sensitive to sporadic disturbances and causes disturbance to the tuning as a result of these. The slower the control the better is the signal-to-noise ratio, but the greater is the difficulty of initially adjusting the oscillator.

Generally such a device is designed to operate at a speed which is a compromise between the two optimum speeds, that is lower than the relatively higher speed which is best for the operation of actually tuning the receiver to the channel required, and higher than the relatively lower speed which is best for maintaining the receiver tuned to a selected frequency.

By making such compromise, however, the device is never allowed to operate under optimum conditions and difficulty can be experienced in coupling to the channel, particularly in conditions of weak signals, and likewise an excessive sensitivity to disturbances of the circuit whilst maintaining the receiver tuned to a selected frequency can be experienced.

The technical problem which the present invention seeks to solve, therefore, is that of providing a receiver, such as a radio or television receiver, with a device for selecting a signal frequency for reception of the above described general type, in which the control loop which controls the voltage controlled oscillator is capable of operating at a relatively higher speed whilst the device is actually tuning the receiver to a selected frequency, and at a relatively lower speed when the device is merely maintaining the receiver tuned to a selected frequency.

According to the present invention a signal receiver having a device for tuning the receiver to a signal frequency selected from a plurality of receivable frequencies, comprises a controllable oscillator having a control input and at least one output, means defining a control loop for controlling the output frequency of said controllable oscillator, said control loop including: a memory circuit operable to produce an output signal the value of which depends on the frequency of the signal selected for reception, an adjustable frequency divider having a control input connected to the output from said memory circuit, and operating to produce an output signal which is divided down from said oscillator frequency, a reference frequency generator operating to generate a reference frequency signal, means for comparing the output signal from said adjustable frequency divider with said reference frequency signal, to produce an output control signal, and first circuit means operable with one of two time constants and having a control input for applying signals to determine said time constant, connected in said control loop between the output from said comparing means and the control input of said controllable oscillator, and second circuit means connected to the control input of said first circuit means whereby to act on said control loop to cause it to operate at one of two different speeds according as the device is operating to tune the receiver to one of said receivable frequencies or has already effected this tuning.

Thus, since it is not possible to reach a satisfactory compromise in the choice of the speed at which the control loop works on the voltage controlled oscillator, the problem has been solved by making the control loop act at different speeds in different circumstances. During the period of time when the receiver is being tuned to the selected frequency the control loop operates with a time constant which is less than that with which it operates during the remainder of this time when the receiver is merely being maintained in tune with the selected frequency.

This commutation of the two time constants could be effected by circuits which detect when coupling to the selected signal frequency has taken place, or by a timing circuit (for example a monostable multivibrator) controlled by the signal selector, which causes the control loop to act initially, for a predetermined period of time, with a small time constant and thereafter (when it is considered that the coupling has taken place) with a greater time constant. This latter arrangement has disadvantages in that the operation of the monostable circuit to effect commutation of the two time constants creates disturbances which appear on the screen and disturb the picture.

It is preferred instead, therefore, to effect this commutation by control through the channel selection keys of the selection keyboard, in such a way that the commutation is effected at the instant when the user's finger releases the key, since this can be achieved without causing any disturbance to the picture.

Figure 2:
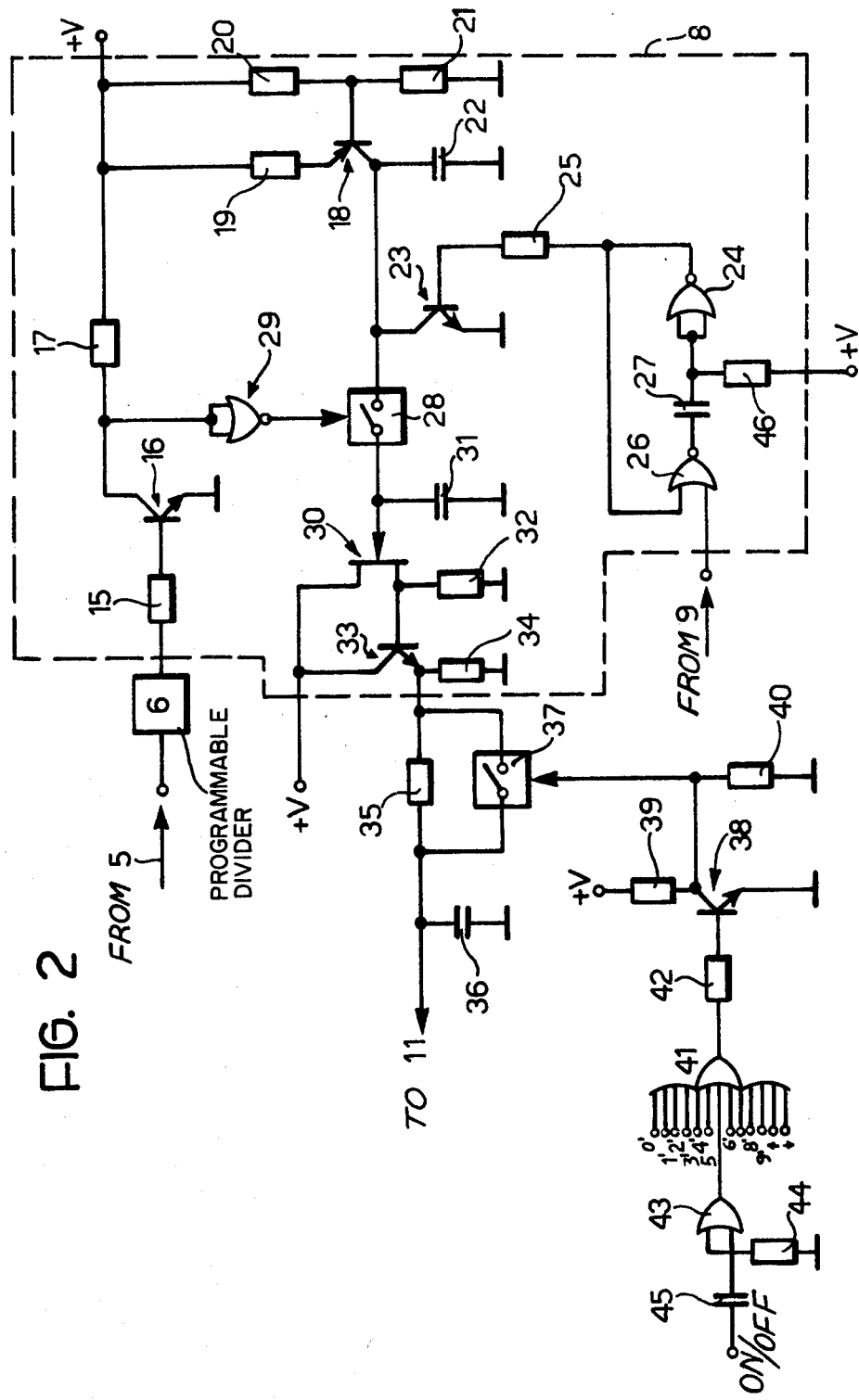

One embodiment of the present invention will now be more particularly described, by way of example, with reference to the accompanying drawings, in which:

FIG. 1 is a block diagram illustrating the general arrangement of a frequency selection device formed as an embodiment of this invention; and FIG. 2 is a diagram illustrating the circuit arrangement of some of the blocks shown in the block diagram of FIG. 1.

Referring now to FIG. 1 of the drawings there are shown the main blocks of the device for tuning a television receiver to a selected channel. This device comprises an oscillator 1 the frequency of which can be controlled by applying a control voltage to a control terminal 3, and which supplies to a first output terminal 2 a persistent oscillation which is fed to a mixing circuit of conventional type (not shown in the drawing).

The controllable oscillator circuit 1 also has a second output terminal 4 at which appears the same signal as appears at the first output terminal 2. This second output terminal 4 is connected to a first divider circuit 5 which divides by a fixed factor. The output of the divider 5 is connected to a second divider circuit 6 the division factor of which is controlled by a signal presented at a control input which is fed from a memory 7. The second divider circuit 6 is, in this embodiment a programmable divider operating to divide by one of a predetermined number of factors in dependence on an address signal which it receives at its second input from the memory 7.

The output of the programmable divider 6 is connected to one input of a frequency comparator circuit 8 which also receives, at a second input, a reference frequency signal from a quartz oscillator circuit 9. The output of the comparator circuit 8 is connected, through a low pass filter circuit 10 and an amplifier circuit 11, to the control input of the voltage controlled oscillator circuit 1.

The filter circuit 10 has two time constants, a relatively larger one and a relatively smaller one, and can be commuted to operate with one or other of the time constants by a control signal on a line 12 which is connected to a control input of the filter circuit 10. This control signal on the line 12 is supplied by an OR gate 13 which has a plurality of inputs each connected to a respective control key of a keyboard 14. The keyboard 14 has 10 keys numbered 0 to 9 which are used for the selection of the required channel, and also various other control keys, such as, for example, two keys for fine tuning of channels after selection and the key for switching the receiver on or off.

Whenever a key of the keyboard 14 is pressed a corresponding control signal is generated and fed to the memory 7 by means which are not shown in the drawing, to control the signal fed by the memory to the input of the programmable divider circuit 6. At the same time a pulse signal is generated which lasts as long as the key is held down, and which is fed to the OR gate 13: this causes the OR gate 13 to produce the control signal to commute the filter circuit 10 to operate with its shorter time constant.

Thus, depression of one of the keys of the keyboard 14 recalls from the memory a number corresponding to the channel selected by that or those keys, and this number is fed as a control signal to the programmable divider 6 to control this to divide the signal generated by the voltage controlled oscillator 1 and already divided down by the divider 5, by a given number which is such that the frequency of the reference signal from the oscillator 9, multiplied by this number, corresponds, to a factor, to the nominal frequency of the chosen channel. The output voltage from the comparator 8 then controls the control loop to cause the frequency of the signal from the programmable divider 6 to coincide with the reference frequency, thereby ensuring the perfect tuning of the receiver to the required channel.

To facilitate the initial tuning of the receiver to a newly selected channel, during the period of time for which the control key of the keyboard 14 is held down, the time constant of the low pass filter 10 is kept small with respect to the optimum time constant necessary to ensure a satisfactory operation of the circuit to maintain the receiver in tune after the initial tuning has been effected. This period of time, which is of the order of some tenths of a second, is more than sufficient to allow the circuit to effect adjustment of the receiver to tune it to the required frequency. Commutation of the time constants is effected by the impulse from the OR gate 13, which as mentioned above appears whenever one of the keys of the keyboard 14 are depressed.

FIG. 2 illustrates the circuit arrangement of some of the components shown in block form in FIG. 1. The programmable divider circuit 6, shown in FIG. 1, is again illustrated in block form. From the programmable divider 6 the signal is fed through a resistor 15 to the base of an NPN transistor 16, the emitter of which is grounded and collector of which is connected to a supply terminal +V through a resistor 17. The terminal +V also biases the emitter of a PNP transistor 18 through a resistor 19 the base of which is biased by a potential divider constituted by two resistors 20 and 21 connected in series between the positive supply +V and ground. The collector of the transistor 18 is connected to ground through a capacitor 22, and is also connected to the collector of an NPN transistor 23 the emitter of which is grounded and the base of which is connected to the output of a NOR gate 24 through a resistor 25.

The NOR gate 24 has two inputs which are connected together and receive a bias from the positive supply +V via a resistor 46. The inputs of NOR gate 24 also receive signals from a NOR gate 26 through a capacitor 27. The NOR gate 26 has two inputs, one of which is connected to the output of the NOR gate 24 and the other input is fed with a square wave signal from the quartz reference oscillator 9 shown in FIG. 1.

The collectors of the transistors 18 and 23 are connected to an electronic switch 28, (constituted by a CMOS switch contained in an integrated circuit type CD 4016), which receives a control signal from the collector of the transistor 16 through an inverting circuit 29 formed by a NOR gate having two inputs which are joined together. The output of the switch 28 is connected to the gate electrode of a FET transistor 30 and to one terminal of a capacitor 31 the other terminal of which is grounded. The discharge electrode (drain) of the FET transistor 30 is connected to the supply voltage +V and the source electrode is grounded through a resistor 32 and also connected to the base of an NPN transistor 33, the collector of which is connected to the voltage supply +V and the emitter of which is grounded through a resistor 34 and connected to the input terminal of the amplifier circuit 11 of FIG. 1 through a series resistor 35.

Connected in parallel across the resistor 35 is an electronic switch 37 similar to the switch 28. The control terminal of the switch 37 is connected to the collector of an NPN transistor 38, the emitter of which is grounded. The collector of the transistor 38 is biased via two resistors 39, 40, one of which (39) is connected to the voltage supply +V and the other of which (40) is grounded.

The base of the transistor 38 is connected to the output of an OR gate 41 through a resistor 42. The OR gate 41 has 13 input terminals of which 10 are associated with respective outputs of the 10 keys for selecting channels, two are associated with respective outputs of the two keys for fine tuning of the channels already selected, and one is connected to the output of an OR gate 43. The OR gate 43 has two inputs which are joined together, grounded through a resistor 44 connected to the ON-OFF switch through a capacitor 45.

The circuit described above operates as follows:

The signal from the oscillator 1 is divided, as described in relation to FIG. 1, by the dividers 5 and 6, and is then fed to the base of the transistor 16 where it is amplified and, after phase inversion and squaring by the NOR gate 29, it is fed to the frequency comparator circuit 8, which comprises the components within the broken line indicated by the reference numeral 8.

The frequency comparator circuit 8 operates as follows:

The reference frequency signal from the oscillator 9 synchronises a generator of monostable impulses, constituted by the two NOR gates 24 and 26, which sends a control impulse to the transistor 23 so as to saturate it periodically. Saturation of the transistor 23 causes the discharge of the capacitor 22 which, on the other hand, is charged through the transistor 18, acting as a constant current source, during the periods in which the transistor 23 is cut off. The signal presented to the input terminal of the electronic switch 28, therefore, is a sawtooth waveform with a frequency equal to that of the reference oscillator 9.

The electronic switch 28 opens only when there is a control signal from the circuit 29, so that the output signal from the switch is large or small according as the control signal from the circuit 29 is late or early in respect to the sawtooth signal at the input of the switch 28. The output of the switch 28 is integrated over a number of cycles by the capacitor 31 and passed by the field effect transistor 30 to the transistor 33 which amplifies it and passes it to the low pass filter constituted by the capacitor 36 and the resistor 35. From the low pass filter the signal is fed to the control terminal of the voltage controlled oscillator 1. The time constant of the low pass filter is commuted by short circuiting the resistor 35 upon closure of the electronic switch 37, when it receives the control impulse from the OR gate 41. It is preferred to commute the value of the resistance of the RC network forming the low pass filter rather than the value of the capacitance since the latter would produce transients at the instant of commutation, which would deleteriously affect the control of the oscillator 1 by the control loop.

The OR gate 41 generates a control impulse whenever any key from the keyboard 14 is pressed. The OR gate 43 with the differentiating network constituted by the resistor 44 and the capacitor 45 is used to produce an impulse, of the same type as those produced by the selection keys of the keyboard 14, suitable to be applied to the OR gate 41 when the receiver is switched on.

In this way each time a key of the keyboard 14 is pressed to select a channel, the time constant of the low pass filter 10 is reduced for the duration of the time for which the key is held down, and therefore the adjustment of the voltage controlled oscillator 1 to the newly selected value by the control loop can take place quickly as the control loop operates with great sensitivity when the low pass filter is operating with a short time constant. The time during which the control key is held down is more than sufficient to allow the required adjustment of the oscillator 1 to be effected, and once the key is released and the time constant of the filter returns to its higher value the circuit operates to maintain the output frequency of the oscillator 1 in a way which is relatively less sensitive to disturbances which occur during normal operation.

The following table gives the values of the circuit elements of the circuit described in FIG. 2 which were used in an experimental version which proved to operate successfully in practice.

| 15 | resistor | 4,7 k ohm |
|----|----------|-----------|
| 16 | transistor | BC 148 C |
| 17 | resistor | 33 k ohm |
| 18 | transistor | BC 148 C |
| 19 | resistor | 6,8 k ohm |
| 20 | resistor | 3,3 k ohm |
| 21 | resistor | 10 k ohm |
| 22 | capacitor | 22 n F |
| 23 | transistor | BC 138 C |
| 24 | gate | ¼ of CD 4001 |
| 25 | resistor | 10 k ohm |
| 26 | gate | ¼ of CD 4001 |
| 27 | capacitor | 1 n F |
| 28 | electronic switch | ¼ of CD 4016 |
| 29 | gate | ¼ of CD 4001 |
| 30 | FET transistor | 2 N 3822 |
| 31 | capacitor | 680 p F |
| 32 | resistor | 6,8 k ohm |
| 33 | transistor | BC 148 C |
| 34 | resistor | 220 ohm |
| 35 | resistor | 180 k ohm |
| 36 | capacitor | 2,2 n F |
| 37 | electronic switch | ¼ of CD 4016 |
| 38 | transistor | BC 148 C |
| 39 | resistor | 33 k ohm |
| 40 | resistor | 1 M ohm |
| 41 | gate | 2 CD 4072 |
| 42 | resistor | 1,8 k ohm |
| 43 | gate | ¼ of CD 4071 |
| 44 | resistor | 1 M ohm |
| 45 | capacitor | 220 n F |
| 46 | resistor | 10 k ohm |
| +V | supply voltage | + 12 V dc |

From the foregoing description it will be appreciated that the advantages of embodiments of this invention include operation of the circuits in an optimum manner both during the initial selection of a channel and during normal running when the circuit operates merely to maintain the receiver in tune.

What is claimed is:

1. A signal receiver having a device for tuning the receiver to a signal frequency, selected from a plurality of receivable frequencies, of the type comprising:
   means to select said signal frequency from said plurality of receivable frequencies,
   a controllable oscillator having a control input and at least one output,
   means defining a control loop for controlling the output frequency of said controllable oscillator, said control loop including:

a memory circuit to produce an output signal the value of which depends on the frequency of the signal selected for reception, an adjustable frequency divider having a control input connected to the output from said memory circuit, and operating to produce an output signal which is divided down from said oscillator frequency, a reference frequency generator operating to generate a reference frequency signal, means for comparing the output signal from said adjustable frequency divider with said reference frequency signal, to produce an output control signal, and first circuit means operable with a first or a second time constant, and having a control input for applying signals to determine said first or second time constant, connected in said control loop between the output from said comparing means and the control input of said controllable oscillator, second circuit means connected to said means to select said signal frequency and to the control input of said first circuit means whereby to act on said control loop to cause it to operate initially at said first time constant, and third circuit means connected to said control input of said first circuit means whereby to act on said control loop to cause it to operate at said second time constant, greater than the first, after a predetermined period of time.

2. A signal receiver as in claim 1 wherein said means to select include a keyboard which, when a key is depressed, generates a first control signal which determines said first time constant of said first circuit means and when said key is released generates a second control signal which determines said second time constant greater than the first one.

3. A signal receiver as in claim 2, wherein said third circuit means include a circuit for determining the minimum duration of said predetermined period of time after which said control loop starts to operate at said second time constant.

4. A signal receiver having a device for tuning the receiver to a signal frequency selected from a plurality of receivable frequencies, of the type comprising:

means to select said signal frequency from said plurality of receivable frequencies, a controllable oscillator having a control input and at least one output, means defining a control loop for controlling the output frequency of said controllable oscillator, said control loop including:

a memory circuit operable to produce an output signal the value of which depends on the frequency of the signal selected for reception, an adjustable frequency divider having a control input connected to the output from said memory circuit, and operating to produce an output signal which is divided down from said oscillator frequency, a reference frequency generator operating to generate a reference frequency signal, means for comparing the output signal from said adjustable frequency divider with said reference frequency signal, to produce an output control signal, and first circuit means operable with a first or a second time constant, and having a control input for applying signals to determine said first or second time constant, connected in said control loop between the output from said comparing means and the control input of said controllable oscillator, second circuit means connected to the control input of said first circuit means whereby to act on said control loop to cause it to operate initially at said first time constant and thereafter at said second time constant in response to a control signal from said means to select, wherein said first circuit means operating with one of said first or second time constants is a low pass filter circuit in said control loop, which includes a resistor and there is provided a first electronic switch controlled by said control signal for controlling commutation of said low pass filter between said two different time constants by short circuiting said resistor of said low pass filter.

5. A signal receiver as in claim 4, wherein said first electronic switch is a CMOS component.

6. A signal receiver having a device for tuning the receiver to a signal frequency selected from a plurality of receivable frequencies, of the type comprising:

means to select said signal frequency from said plurality of receivable frequencies, a controllable oscillator having a control input and at least one output, means defining a control loop for controlling the output frequency of said controllable oscillator, said control loop including:

memory circuit operable to produce an output signal the value of which depends on the frequency of the signal selected for reception, an adjustable frequency divider having a control input connected to the outpout from said memory circuit, and operating to produce an output signal which is divided from said ocillator frequency, a reference frequency generator operating to generate a reference frequency signal, means for comparing the output signal from said adjustable frequency divider with said reference frequency signal, to produce an output control signal, and first circuit means operable with a first or a second time constant, and having a control input for applying signals to determine said first or second time constant, connected in said control loop between the output from said comparing means and the control input of said controllable oscillator, second circuit means connected said means to select said signal frequency and to the control input of said first circuit means whereby to act on said control loop to cause it to operate initially at said first time constant and thereafter at said second time constant in response to a control signal from said means to select, wherein said means to select includes a keyboard for selecting radio or television channels when a key of the keyboard is depressed, which keyboard generates said control signal for changing said time constant of said first circuit means whenever any key of said keyboard is depressed and wherein said second circuit means includes a first OR gate, each key of said keyboard being connected to the input of said first OR gate, the output of said first OR gate being connected to said control input.

7. A signal receiver as in claim 6, wherein said receiver has an on/off switch,
a second OR gate,
a differentiating network connecting said on/off switch to the input of said second OR gate, the output of said second OR gate being connected to an input of said first OR gate.

8. A signal receiver having a device for tuning the receiver to a signal frequency selected from a plurality of receivable frequencies, of the type comprising:
means to select said frequency from said plurality of receivable frequencies, a controllable oscillator having a control input and at least one output,
means defining a control loop for controlling the output frequency of said controllable oscillator, said control loop including:
memory circuit operable to produce an output signal the value of which depends on the frequency of the signal selected for reception,
an adjustable frequency divider having a control input connected to the output from said memory circuit, and operating to produce an output signal which is divided down from said oscillator frequency,
a reference oscillator operating to generate a reference frequency signal,
means for comparing the output signal from said adjustable frequency divider with said reference frequency signal, to produce an output control signal, and
first circuit means operable with a first or a second time constant, and having a control input for applying signals to determine said first or second time constant, connected in said control loop between the output from said comparing means and the control input of said controllable oscillator,
second circuit means connected to the control input of said first circuit means whereby to act on said control loop to cause it to operate intially at said first time constant and thereafter at said second time constant in response to a control signal from said means to select,
wherein said means for comparing the output signal from said adjustable frequency divider circuit with said reference frequency signal is a comparator, connected to the output from said adjustable frequency divider and to said reference oscillator, said comparator including a circuit for generating a sawtooth waveform signal at the frequency of the reference signal, said circuit comprising a capacitor,
means including a transistor acting as a constant current generator for periodically charging said capacitor,
an electronic switch controlled to open or close by a signal at the frequency of the output signal from said adjustable frequency divider, and
means for applying the output from said circuit for generating a sawtooth waveform signal to said second electronic switch.

* * * * *